(12) United States Patent
Yamada et al.

(10) Patent No.: US 12,191,634 B2
(45) Date of Patent: Jan. 7, 2025

(54) SEMICONDUCTOR LASER ELEMENT

(71) Applicant: Nuvoton Technology Corporation Japan, Kyoto (JP)

(72) Inventors: Kazuya Yamada, Toyama (JP); Tougo Nakatani, Toyama (JP); Hiroki Nagai, Toyama (JP); Masayuki Hata, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 668 days.

(21) Appl. No.: 17/487,405

(22) Filed: Sep. 28, 2021

(65) Prior Publication Data

US 2022/0013987 A1 Jan. 13, 2022

Related U.S. Application Data

(63) Continuation of application No. PCT/JP2020/014960, filed on Mar. 31, 2020.
(Continued)

(51) Int. Cl.
*H01S 5/16* (2006.01)
*H01S 5/32* (2006.01)
(Continued)

(52) U.S. Cl.
CPC ............... *H01S 5/16* (2013.01); *H01S 5/162* (2013.01); *H01S 5/164* (2013.01); *H01S 5/3213* (2013.01); *H01S 5/20* (2013.01); *H01S 5/34* (2013.01)

(58) Field of Classification Search
CPC . H01S 5/16; H01S 5/163; H01S 5/164; H01S 5/2031; H01S 5/3213
See application file for complete search history.

(56) References Cited

U.S. PATENT DOCUMENTS

2002/0061044 A1\* 5/2002 Kuniyasu ............... H01S 5/16
372/46.012
2002/0097763 A1\* 7/2002 Marsh .................. H01S 5/024
372/46.01
(Continued)

FOREIGN PATENT DOCUMENTS

JP 2004-087836 A 3/2004
JP 4789558 B2 10/2011
(Continued)

OTHER PUBLICATIONS

International Search Report and Written Opinion issued on Jul. 14, 2020 in International Patent Application No. PCT/JP2020/014960; with partial English translation.

*Primary Examiner* — Michael Carter
(74) *Attorney, Agent, or Firm* — Rimon P.C.

(57) ABSTRACT

A semiconductor laser element includes: a first conductivity-type cladding layer; a first guide layer disposed above the first conductivity-type cladding layer; an active layer disposed above the first guide layer; and a second conductivity-type cladding layer disposed above the active layer. A window region is formed in a region of the active layer including part of at least one of the front-side end face or the rear-side end face, the first conductivity-type cladding layer consists of $(Al_xGa_{1-x})_{0.5}In_{0.5}P$, the first guide layer consists of $(Al_yGa_{1-y})_{0.5}In_{0.5}P$, and the second conductivity-type cladding layer consists of $(Al_zGa_{1-z})_{0.5}In_{0.5}P$, where x, y, and z each denote an Al composition ratio, $0<x-y<z-y$ is satisfied, and $D/L>0.03$ is satisfied, where L denotes a length of the resonator and D denotes a length of the window region in the first direction.

20 Claims, 11 Drawing Sheets

Related U.S. Application Data

(60) Provisional application No. 62/828,156, filed on Apr. 2, 2019.

(51) Int. Cl.
*H01S 5/20* (2006.01)
*H01S 5/34* (2006.01)

(56) References Cited

U.S. PATENT DOCUMENTS

| | | | | |
|---|---|---|---|---|
| 2002/0163949 A1* | 11/2002 | Matsumoto | ............ | H01S 5/162 |
| | | | | 372/46.01 |
| 2003/0021313 A1* | 1/2003 | Marsh | .................. | B82Y 20/00 |
| | | | | 372/45.01 |
| 2004/0120378 A1* | 6/2004 | Tanaka | .................. | B82Y 20/00 |
| | | | | 372/45.01 |
| 2006/0215723 A1* | 9/2006 | Watanabe | ............... | H01S 5/162 |
| | | | | 372/103 |
| 2007/0064752 A1* | 3/2007 | Takayama | ............... | H01S 5/162 |
| | | | | 372/23 |
| 2020/0169058 A1* | 5/2020 | Sato | ..................... | H01S 5/0203 |

FOREIGN PATENT DOCUMENTS

| | | | |
|---|---|---|---|
| JP | 2013-247210 A | 12/2013 | |
| WO | WO-2019026953 A1 * | 2/2019 | ........... B28D 5/0011 |

* cited by examiner

First direction →

FIG. 9

| Layer structure | Composition | Thickness (µm) |
|---|---|---|
| P-type contact layer 57 | p-GaAs | 0.23 |
| P-type graded interlayer 56 | p-$Al_xGa_{1-x}As$ (x = 0.55 to 0.05) | 0.05 |
| P-type interlayer 55 | p-$(Al_{0.1}Ga_{0.9})_{0.5}In_{0.5}P$ | 0.106 |
| P-type third cladding layer 54 | p-$(Al_{0.30}Ga_{0.70})_{0.5}In_{0.5}P$ | 0.6 |
| P-type second cladding layer 53 | p-$(Al_{0.60}Ga_{0.40})_{0.5}In_{0.5}P$ | 0.4 |
| P-type first cladding layer 52 | p-$(Al_{0.25}Ga_{0.75})_{0.5}In_{0.5}P$ | 0.17 |
| P-side light guide layer 51 | p-$(Al_{0.04}Ga_{0.96})_{0.5}In_{0.5}P$ | 0.13 |
| Barrier layer 45 | $Al_{0.59}Ga_{0.41}As$ | 0.021 |
| Well layer 44 | GaAs | 0.0065 |
| Barrier layer 43 | $Al_{0.59}Ga_{0.41}As$ | 0.004 |
| Well layer 42 | GaAs | 0.0065 |
| Barrier layer 41 | $Al_{0.59}Ga_{0.41}As$ | 0.02 |
| N-side light guide layer 34 | n-$(Al_{0.04}Ga_{0.96})_{0.5}In_{0.5}P$ | 0.05 |
| N-type cladding layer 33 | n-$(Al_{0.14}Ga_{0.86})_{0.5}In_{0.5}P$ | 3.2 |
| N-type graded buffer layer 32 | n-$Al_xGa_{1-x}As$ (x = 0.05 to 0.35) | 0.075 |
| N-type buffer layer 31 | n-GaAs | 0.4 |
| Substrate 24 | n-GaAs | — |

SEMICONDUCTOR LASER ELEMENT

CROSS REFERENCE TO RELATED APPLICATIONS

This is a continuation application of PCT International Application No. PCT/JP2020/014960 filed on Mar. 31, 2020, designating the United States of America, which is based on and claims priority of U.S. Provisional Application No. 62/828,156 filed on Apr. 2, 2019. The entire disclosures of the above-identified applications, including the specifications, drawings and claims are incorporated herein by reference in their entirety.

FIELD

The present disclosure relates to semiconductor laser elements.

BACKGROUND

Semiconductor laser elements have been conventionally known as small light sources having high output power. To ensure reliability of such a semiconductor laser element, a technique of forming a window region in the vicinity of an end face from which light is emitted has been known. In the window region, the energy band gap is increased by diffusing an impurity (see Patent Literature (PTL) 1, for example).

CITATION LIST

Patent Literature

PTL 1: International Publication No. WO 2019/026953

SUMMARY

Technical Problem

In the semiconductor laser device disclosed in PTL 1, the light intensity distribution is biased toward the n-type cladding layer due to the refractive index relationship between the p-type cladding layer and the n-type cladding layer to reduce waveguide loss. However, the semiconductor laser device disclosed in PTL 1 also reduces waveguide loss in a higher order mode that affects variation in vertical divergence angle (the divergence angle of laser light in the stacking direction of the semiconductor layer), and higher order modes are mixed. This increases variation in vertical divergence angle.

The present disclosure is conceived to solve the above, and aims to provide a semiconductor laser element that includes a window structure and stabilizes a characteristic of a vertical divergence angle.

Solution to Problem

In order to achieve the above, a semiconductor laser element according to one aspect of the present disclosure is a semiconductor laser element including a resonator in which laser light resonates in a first direction between a front-side end face and a rear-side end face. The semiconductor laser element includes: a first conductivity-type cladding layer disposed above a first conductivity-type semiconductor substrate; a first guide layer disposed above the first conductivity-type cladding layer; an active layer disposed above the first guide layer; and a second conductivity-type cladding layer disposed above the active layer. A window region is formed in a region of the active layer including part of at least one of the front-side end face or the rear-side end face, the first conductivity-type cladding layer consists of $(Al_xGa_{1-x})_{0.5}In_{0.5}P$, where x denotes an Al composition ratio, the first guide layer consists of $(Al_yGa_{1-y})_{0.5}In_{0.5}P$, where y denotes an Al composition ratio, the second conductivity-type cladding layer consists of $(Al_zGa_{1-z})_{0.5}In_{0.5}P$, where z denotes an Al composition ratio, $0<x-y<z-y$ is satisfied, and $D/L>0.03$ is satisfied, where L denotes a length of the resonator and D denotes a length of the window region in the first direction.

Moreover, a semiconductor laser element according to one aspect of the present disclosure is a semiconductor laser element including a resonator in which laser light resonates in a first direction between a front-side end face and a rear-side end face. The semiconductor laser element includes: a first conductivity-type cladding layer disposed above a first conductivity-type semiconductor substrate; a first guide layer disposed above the first conductivity-type cladding layer; an active layer disposed above the first guide layer; and a second conductivity-type cladding layer disposed above the active layer. A window region is formed in a region of the active layer including part of at least one of a front-side end face or a rear-side end face, the first conductivity-type cladding layer consists of $(Al_xGa_{1-x})_{0.5}In_{0.5}P$, where x denotes an Al composition ratio, the first guide layer consists of $(Al_yGa_{1-y})_{0.5}In_{0.5}P$, where y denotes an Al composition ratio, the second conductivity-type cladding layer consists of $(Al_zGa_{1-z})_{0.5}In_{0.5}P$, where z denotes an Al composition ratio, $0<x-y<z-y$ is satisfied, the window region includes a stable window region having an energy band gap that is at least 30 meV greater than an energy band gap of a region of the active layer other than the window region, and $D1/L>0.01$ is satisfied, where L denotes a length of the resonator and D1 denotes a length of the window region in the first direction.

Moreover, a semiconductor laser element according to one aspect of the present disclosure is a semiconductor laser element including a resonator in which laser light resonates in a first direction between a front-side end face and a rear-side end face. The semiconductor laser element includes: a first conductivity-type cladding layer disposed above a first conductivity-type semiconductor substrate; a first guide layer disposed above the first conductivity-type cladding layer; an active layer disposed above the first guide layer; and a second conductivity-type cladding layer disposed above the active layer. A window region is formed in a region of the active layer including part of at least one of a front-side end face or a rear-side end face, a refractive index of the first guide layer is greater than a refractive index of the first conductivity-type cladding layer, and a difference between the refractive index of the first guide layer and the refractive index of the first conductivity-type cladding layer is less than a difference between the refractive index of the first conductivity-type cladding layer and a refractive index of the second conductivity-type cladding layer, and $D/L>0.03$ is satisfied, where L denotes a length of the resonator and D denotes a length of the window region in the first direction.

Moreover, a semiconductor laser element according to one aspect of the present disclosure is a semiconductor laser element including a resonator in which laser light resonates in a first direction between a front-side end face and a rear-side end face. The semiconductor laser element includes: a first conductivity-type cladding layer disposed above a first conductivity-type semiconductor substrate; a first guide layer disposed above the first conductivity-type cladding layer; an active layer disposed above the first guide layer; and a second conductivity-type cladding layer disposed above the active layer. A window region is formed in a region including part of at least one of a front-side end face or a rear-side end face, a refractive index of the first guide layer is greater than a refractive index of the first conductivity-type cladding layer, and a difference between the refractive index of the first guide layer and the refractive index of the first conductivity-type cladding layer is less than a difference between the refractive index of the first conductivity-type cladding layer and a refractive index of the second conductivity-type cladding layer, the window region includes a stable window region having an energy band gap that is at least 30 meV greater than an energy band gap of a region of the active layer other than the window region, and D1/L>0.01 is satisfied, where L denotes a length of the resonator and D1 denotes a length of the window region in the first direction.

Advantageous Effects

The present disclosure provides a semiconductor laser element that includes a window structure and stabilizes dependence of a characteristic of a vertical divergence angle on optical output power.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 9 is a table showing a layer structure of the semiconductor laser element according to Embodiment 1.

DESCRIPTION OF EMBODIMENTS

Hereinafter, embodiments of the present disclosure will be described with reference to the drawings. Note that each of the embodiments described below shows a specific example of the present disclosure. Therefore, the numerical values, shapes, materials, structural components, the arrangement and connection of the structural components, steps and the order of the steps mentioned in the following embodiments are mere examples and not intended to limit the present disclosure.

In addition, each diagram is a schematic diagram and is not necessarily a precise illustration. Accordingly, for example, each diagram is not necessarily to scale. Moreover, throughout the figures, structural components that are substantially the same share like reference signs, and duplicate description is omitted or simplified.

In the present disclosure, the terms "above" and "below" do not refer to the upward (vertically upward) direction and downward (vertically downward) direction in the sense of absolute spatial recognition, but are defined by the relative positional relationship based on the stacking order of a stacked structure. The terms "above" and "below" are applied not only when two structural components are positioned spaced apart from each other and another structural component is present between the two structural components, but also when two structural components are disposed in contact with each other.

Embodiment 1

[1-1. Overall Structure]

Figure 1:
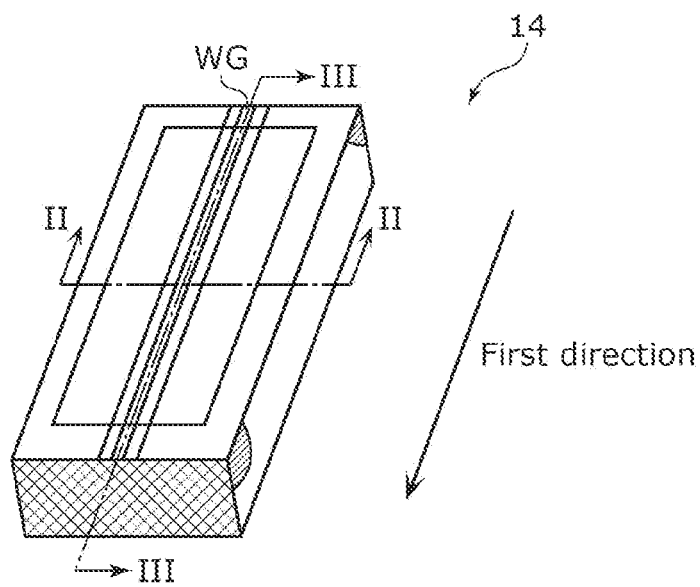
FIG. 1 is a perspective view schematically illustrating an external view of a semiconductor laser element according to Embodiment 1.

First, an overall structure of a semiconductor laser element according to Embodiment 1 will be described with reference to FIGS. 1 to 4. FIG. 1 is a perspective view schematically illustrating an external view of semiconductor laser element 14 according to the present embodiment. FIG.

Figure 2:
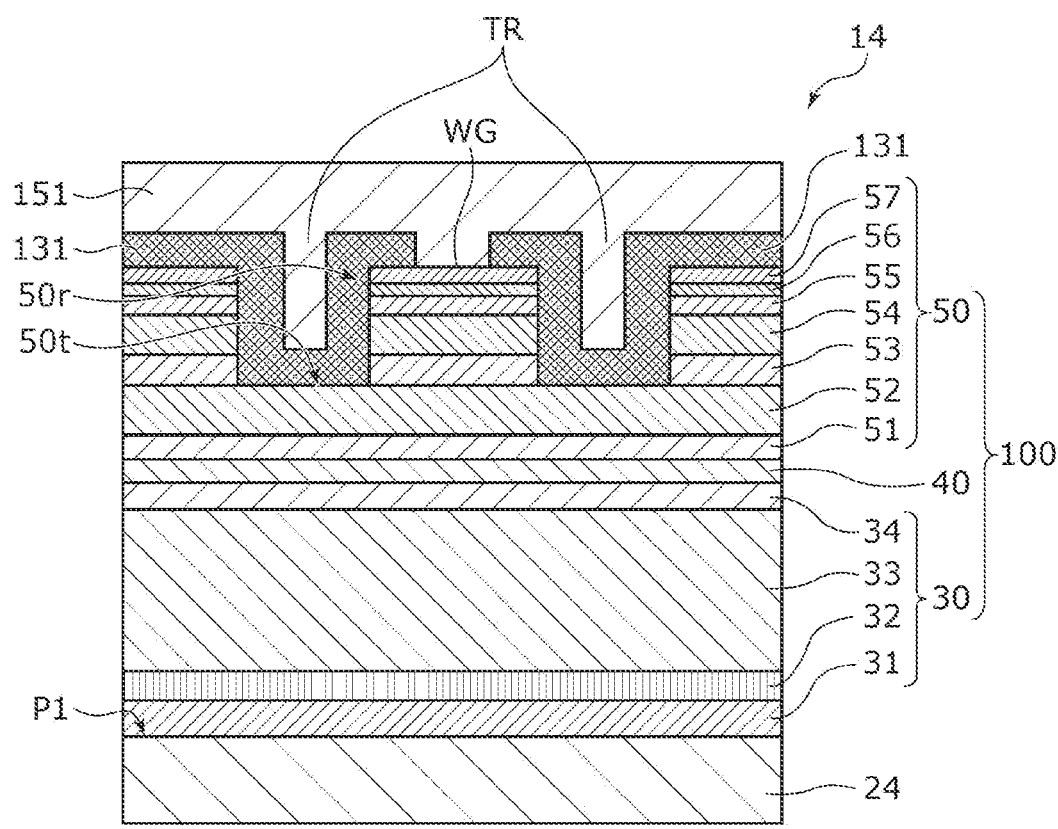
FIG. 2 is a first sectional view schematically illustrating a configuration of the semiconductor laser element according to Embodiment 1.
Figure 3:
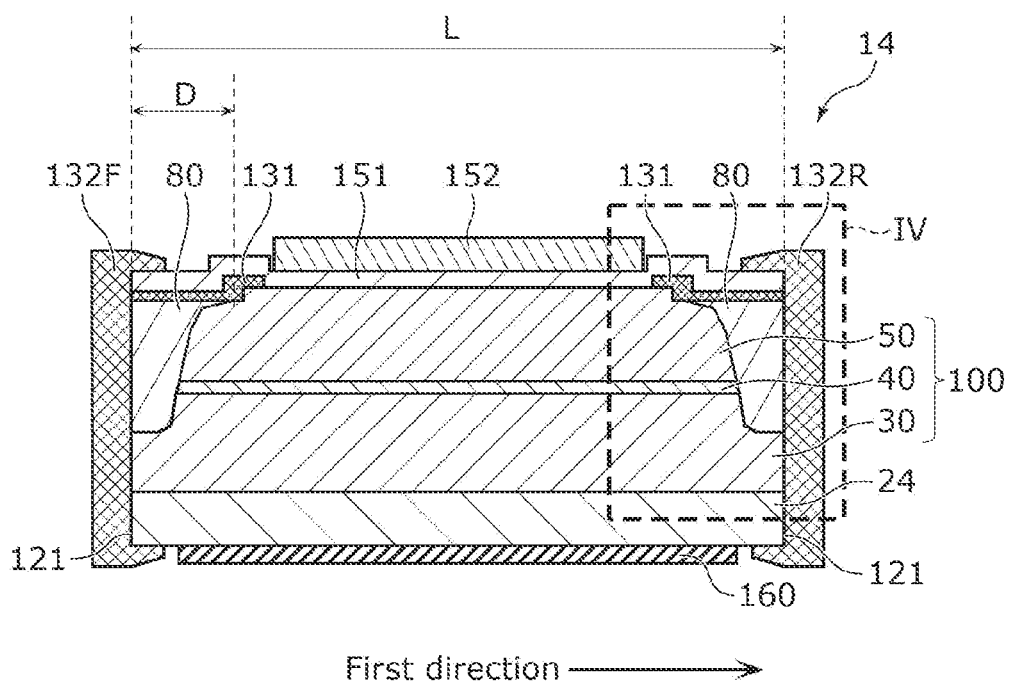
FIG. 3 is a second sectional view schematically illustrating the configuration of the semiconductor laser element according to Embodiment 1.
Figure 4:
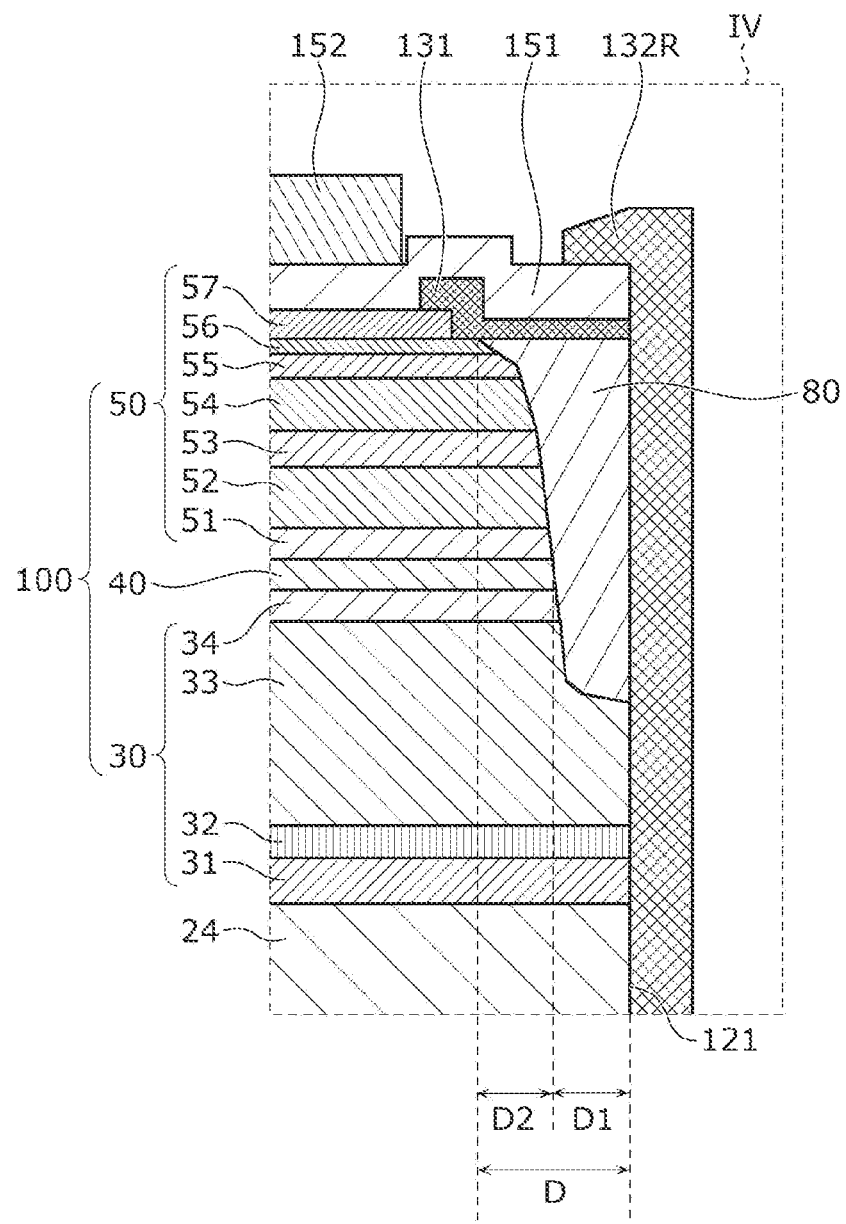
FIG. 4 is a partially enlarged view of FIG. 3.

2 is a first sectional view schematically illustrating a configuration of semiconductor laser element 14 according to the present embodiment. FIG. 2 illustrates an enlarged view of a section taken along the line II-II in FIG. 1 in the vicinity of waveguide WG. FIG. 3 is a second sectional view schematically illustrating the configuration of semiconductor laser element 14 according to the present embodiment. FIG. 3 illustrates a section taken along the line III-III in FIG. 1. FIG. 4 is a partially enlarged view of FIG. 3. FIG. 4 illustrates an enlarged view of the dotted frame IV part in FIG. 3.

As illustrated in FIG. 2, semiconductor laser element 14 is an element including a resonator in which laser light resonates in a first direction between a front-side end face and a rear-side end face. In the present embodiment, semiconductor laser element 14 includes substrate 24 and semiconductor layer 100 disposed on first face P1 of substrate 24. Semiconductor laser element 14 further includes first protective film 131.

Substrate 24 is a first conductivity-type semiconductor substrate on which semiconductor layer 100 of semiconductor laser element 14 is stacked. In the present embodiment, substrate 24 is an n-type semiconductor substrate containing GaAs, more specifically, an n-GaAs substrate whose plane direction is inclined 10 degrees from the (100) plane toward the (011) plane. The plane direction of first face P1 is a 10-degree off angled (100) plane, which is inclined 10 degrees toward the (011) plane.

Semiconductor layer 100 includes: first semiconductor layer 30 including an n-type layer; active layer 40; and second semiconductor layer 50 including a p-type layer, which are stacked in stated order from the substrate 24 side. In the present embodiment, semiconductor layer 100 mainly includes: n-type cladding layer 33 that is a first conductivity-type cladding layer disposed above substrate 24; n-side light guide layer 34 that is a first guide layer disposed above n-type cladding layer 33; active layer 40 disposed above n-side light guide layer 34; p-side light guide layer 51 that is a second light guide layer disposed above active layer 40; and a second conductivity-type cladding layer disposed above p-side light guide layer 51. In the present embodiment, the second conductivity-type cladding layer includes: p-type first cladding layer 52 that is a lower layer; and p-type second cladding layer 53 and p-type third cladding layer 54 that are upper layers, which are disposed in stated order from the active layer 40 side. Hereinafter, the second conductivity-type cladding layer is also referred to as a p-type cladding layer.

As illustrated in FIG. 3, semiconductor laser element 14 includes: p-side lower electrode 151 and p-side upper electrode 152 disposed above semiconductor layer 100; and n-side electrode 160 disposed on a face of substrate 24 on which semiconductor layer 100 is not disposed.

In addition, semiconductor layer 100 of semiconductor laser element 14 includes waveguide WG formed in an intra-layer direction of semiconductor layer 100. In other words, waveguide WG is formed in a direction parallel to the principal face of semiconductor layer 100 (i.e., parallel to first face P1 of substrate 24). In the present embodiment, in semiconductor layer 100, waveguide WG having a ridge structure is formed. Waveguide WG extends in the first direction as illustrated in FIG. 1.

Moreover, in the present embodiment, the width of waveguide WG ranges from approximately 2.5 μm to 3.5 μm, for example. If the width of waveguide WG is too wide, the transverse mode is not stable and a kink (i.e., the optical output power significantly varies in response to minute variation in the supply current of semiconductor laser element 14) is more likely to occur. On the other hand, if the width of waveguide WG is too narrow, the operating voltage increases, and the optical output power decreases due to an effect of heat generation.

Moreover, as illustrated in FIG. 3, the end faces of semiconductor laser element 14 in the first direction correspond to cleaved end faces 121. The two cleaved end faces 121 function as resonator faces of semiconductor laser element 14. In other words, one of the two cleaved end faces 121 serves as the front-side end face (i.e., an end face from which laser light is mainly emitted), and the other cleaved end face 121 serves as the rear-side end face (i.e., an end face from which less laser light is emitted than the laser light emitted from the front-side end face). On the two cleaved end faces 121, second protective films 132F and 132R each serving as a reflectance control film are formed. Second protective films 132F and 132R not only serve as reflectance control films on the front side and the rear side of the resonator, but also have a function of protecting cleaved end faces 121.

In addition, as illustrated in FIG. 3 and FIG. 4, semiconductor layer 100 includes window regions 80 formed at both ends of waveguide WG. In the present embodiment, window regions 80 for suppressing light absorption in active layer 40 are formed in the vicinity of the respective two cleaved end faces 121 serving as the resonator faces.

Moreover, in the present embodiment, length L of the resonator (i.e., the distance between the two cleaved end faces 121) is approximately less than or equal to 300 μm. Note that the range of length L of the resonator may be greater than or equal to 200 μm.

The following describes each of the structural components of semiconductor laser element 14.

On substrate 24, semiconductor layer 100 is stacked. The configuration of substrate 24 is not particularly limited. In the present embodiment, substrate 24 is an n-GaAs substrate as described above. Moreover, n-type impurity concentration of substrate 24 is higher than n-type impurity concentration of n-type cladding layer 33, which will be described later.

First semiconductor layer 30 is a semiconductor layer that includes a first conductivity-type layer. The configuration of first semiconductor layer 30 is not particularly limited. In the present embodiment, as illustrated in FIG. 2, first semiconductor layer 30 includes n-type buffer layer 31, n-type graded buffer layer 32, n-type cladding layer 33, and n-side light guide layer 34.

N-type buffer layer 31 is an n-GaAs layer having a thickness of 0.4 μm.

N-type graded buffer layer 32 is an $Al_qGa_{1-q}As$ layer having a thickness of 0.075 μm, and the Al composition ratio gradually varies in the stacking direction. More specifically, the Al composition ratio of n-type graded buffer layer 32 gradually varies from q=0.05 to q=0.35 from the interface with n-type buffer layer 31 to the interface with n-type cladding layer 33. This smooths a spike-like hetero-barrier generated between substrate 24 and n-type cladding layer 33.

N-type cladding layer 33 consists of $(Al_xGa_{1-x})_{0.5}In_{0.5}P$, where x denotes an Al composition ratio. In the present embodiment, n-type cladding layer 33 is an n-$(Al_{0.14}Ga_{0.86})_{0.5}In_{0.5}P$ layer having a thickness of 3.2 μm.

N-side light guide layer 34 consists of $(Al_yGa_{1-y})_{0.5}In_{0.5}P$, where y denotes an Al composition ratio. In the present embodiment, n-side light guide layer 34 is an $(Al_{0.04}Ga_{0.96})_{0.5}In_{0.5}P$ layer having a thickness of 0.05 μm.

Active layer 40 is a layer serving as a light-emitting unit of semiconductor laser element 14. Window region 80 is formed in a region of active layer 40 including part of at least one of a front-side end face or a rear-side end face. In the present embodiment, window regions 80 are formed in regions of active layer 40 that respectively include part of the front-side end face and the rear-side end face. The configuration of active layer 40 is not particularly limited. In the present embodiment, active layer 40 includes a well layer and barrier layers, and has a quantum well structure. The quantum well structure is sandwiched between p-side light guide layer 51 and n-side light guide layer 34, which will be described later, and includes one or more well layers containing GaAs, and a plurality of barrier layers containing AlGaAs. For example, active layer 40 is a multiple quantum well active layer including, from the n-side light guide layer 34 side, $Al_{0.59}Ga_{0.41}As$ barrier layer 41 having a thickness of 0.02 μm; GaAs well layer 42 having a thickness of 0.0065 μm; $Al_{0.59}Ga_{0.41}As$ barrier layer 43 having a thickness of 0.004 μm; GaAs well layer 44 having a thickness of 0.0065 μm; and $Al_{0.59}Ga_{0.41}As$ barrier layer 45 having a thickness of 0.021 μm (see FIG. 9, which will be described later). Note that active layer 40 may include a well layer other than a GaAs well layer.

Second semiconductor layer 50 is a semiconductor layer that includes a second conductivity-type layer having a conductivity-type different from the conductivity-type of the first conductivity-type layer. The configuration of second semiconductor layer 50 is not particularly limited. In the present embodiment, as illustrated in FIG. 2, second semiconductor layer 50 includes p-side light guide layer 51, p-type first cladding layer 52, p-type second cladding layer 53, p-type third cladding layer 54, p-type interlayer 55, p-type graded interlayer 56, and p-type contact layer 57.

P-side light guide layer 51 is a second guide layer disposed between the p-type cladding layer and active layer 40. In the present embodiment, p-side light guide layer 51 is an $(Al_{0.04}Ga_{0.96})_{0.5}In_{0.5}P$ layer having a thickness of 0.13 μm.

P-type first cladding layer 52 is a p-$(Al_{0.25}Ga_{0.75})_{0.5}In_{0.5}P$ layer having a thickness of 0.17 μm. P-type second cladding layer 53 is a p-$(Al_{0.60}Ga_{0.40})_{0.5}In_{0.5}P$ layer having a thickness of 0.4 μm. P-type third cladding layer 54 is a p-$(Al_{0.30}Ga_{0.70})_{0.5}In_{0.5}P$ layer having a thickness of 0.6 μm. Note that p-type first cladding layer 52, p-type second cladding layer 53, and p-type third cladding layer 54 are examples of the layers included in the second conductivity-type cladding layer (hereinafter, also referred to as p-type cladding layer) according to the present embodiment.

P-type interlayer 55 is a p-$(Al_{0.1}Ga_{0.9})_{0.5}In_{0.5}P$ layer having a thickness of 0.106 μm. The Al composition ratio of p-type interlayer 55 is lower than the Al composition ratio of p-type third cladding layer 54. P-type graded interlayer 56 is an p-$Al_rGa_{1-r}As$ layer having a thickness of 0.05 μm, and the Al composition ratio gradually varies in the stacking direction. More specifically, the Al composition ratio of p-type graded interlayer 56 gradually varies from r=0.55 to r=0.05 from the interface with p-type interlayer 55 to the interface with p-type contact layer 57. P-type contact layer 57 is a p-GaAs layer having a thickness of 0.23 μm. This smooths a spike-like hetero barrier generated between p-type interlayer 55 and p-type contact layer 57.

In the present embodiment, the p-type cladding layer (i.e., p-type first cladding layer 52, p-type second cladding layer 53, and p-type third cladding layer 54) includes upper face 50t that is an upper end face; and ridge 50r that protrudes upward from upper face 50t and extends in the first direction. Ridge 50r is formed by forming two trenches TR from the upper face of second semiconductor layer 50. This means that ridge 50r is formed between the two trenches TR. The bottom face of each trench TR is upper face 50t.

At upper face 50t, p-type first cladding layer 52, which is a lower layer of the p-type cladding layer, is exposed from p-type second cladding layer 53 and p-type third cladding layer 54, which are upper layers.

Note that, the cladding layer including the aforementioned n-type cladding layer 33 and the p-type cladding layer is a layer having a function of confining light in the stacking direction of semiconductor layer 100 (i.e., the normal direction of the principal face of substrate 24), having a refractive index lower than an effective refractive index of semiconductor laser element 14 for light confined in the stacking direction, and having a thickness greater than 0.1 μm. Note that a material doped to the aforementioned n-type buffer layer 31, n-type graded buffer layer 32, and n-type cladding layer 33 (i.e., n-type impurity) is not particularly limited. Si, Se, and Te may be used as such a material, for example. Si is used in the present embodiment. A material doped to p-type first cladding layer 52, p-type second cladding layer 53, p-type third cladding layer 54, p-type interlayer 55, p-type graded interlayer 56, and p-type contact layer 57 (i.e., p-type impurity) is not particularly limited. Zn, Mg, and C may be used as such a material, for example. Zn is used in the present embodiment. Moreover, C may be used only in p-type contact layer 57. If length L of the resonator of semiconductor laser element 14 is short, the operating voltage increases. Therefore, C may be used because C can be doped at a higher impurity concentration. This reduces the operating voltage.

First protective film 131 is a dielectric film disposed on upper faces 50t. First protective film 131 is formed on part of the top portion and the sides of ridge 50r forming waveguide WG, trenches TR, and flat portions on both sides, as illustrated in FIG. 2. At the top portion of ridge 50r, first protective film 131 has an opening that exposes ridge 50r. As illustrated in FIG. 4, first protective film 131 covers a region including window region 80 in the vicinity of each cleaved end face 121. First protective film 131 is not particularly limited as long as it is a dielectric film. For example, SiN, $SiO_2$, $TiO_2$, $ZrO_2$, $Al_2O_3$, $Nb_2O_5$, and $Ta_2O_5$ may be used. In the present embodiment, first protective film 131 is an SiN film having a thickness of approximately 180 nm. In this case, the refractive index of first protective film 131 is lower than the refractive index of p-type first cladding layer 52, which is a lower layer exposed at upper face 50t. This allows laser light to be confined in this lower layer.

P-side lower electrode 151 illustrated in FIG. 2 through FIG. 4 is a patterned metal film. In the present embodiment, p-side lower electrode 151 includes a Ti film having a thickness of approximately 50 nm, a Pt film having a thickness of approximately 150 nm, and an Au film having a thickness of approximately 50 nm, which are stacked in stated order from the semiconductor layer 100 side. P-side lower electrode 151 is connected to p-type contact layer 57 in the opening of first protective film 131.

P-side upper electrode 152 illustrated in FIG. 3 is an Au film having a thickness of from 2.0 μm to 5.0 μm in the present embodiment.

In the present embodiment, n-side electrode 160 illustrated in FIG. 3 includes an AuGe film having a thickness of 90 nm, an Ni film having a thickness of 20 nm, an Au film having a thickness of 50 nm, a Ti film having thickness of 100 nm, a Pt film having a thickness of 50 nm, a Ti film having a thickness of 50 nm, a Pt film having a thickness of 100 nm, and an Au film having a thickness of 500 nm, which are stacked in stated order from the substrate 24 side.

In the present embodiment, second protective film 132F used for cleaved end face 121 on the front side is a dielectric multilayer film obtained by stacking a combination of an $Al_2O_3$ film having a thickness of 50 nm and a $Ta_2O_5$ film having a thickness of 55 nm once or more than once from the cleaved end face 121 side. Moreover, second protective film 132R used for cleaved end face 121 on the rear side is a dielectric multilayer film obtained by stacking an $Al_2O_3$ film having a thickness of $\lambda/8$ nA, an $SiO_2$ film having a thickness of $\lambda/8$ nS, and a $Ta_2O_5$ film having a thickness of $\lambda/4$ nT in stated order from the cleaved end face 121 side, and then stacking a combination of an $SiO_2$ film having a thickness of $\lambda/4$ nS and a $Ta_2O_5$ film having a thickness of $\lambda/4$ nT more than once. Note that A denotes an oscillation wavelength of semiconductor laser element 14, and nA, nT, and nS respectively denote the refractive indexes of the $Al_2O_3$ film, $Ta_2O_5$ film, and $SiO_2$ film with respect to light having wavelength A. In the present embodiment, A is approximately 860 nm, and an $Al_2O_3$ film having a thickness of 65 nm, an $SiO_2$ film having a thickness of 74 nm, and $Ta_2O_5$ film having a thickness of 102 nm are stacked in stated order from the cleaved end face 121 side, and then a combination of an $SiO_2$ film having a thickness of 147 nm and a $Ta_2O_5$ film having a thickness of 102 nm is stacked more than once.

Window region 80 is formed by diffusing an impurity for forming a window region, such as Zn. Window region 80 is a region in which the energy band gap of active layer 40 is increased by diffusing the impurity for forming a window region in semiconductor layer 100 in the vicinity of cleaved end face 121 of semiconductor laser element 14.

Window region 80 is formed by disordering the quantum well structure of active layer 40. In other words, part of the quantum well structure in the vicinity of cleaved end face 121 is a disordered region. An example of a window region in which the quantum well structure is disordered is as follows: active layer 40 other than the window region includes a well layer having a composition of $Al_{h1}Ga_{(1-h1-i1)}In_{i1}As$ and barrier layers having a composition of $Al_{j1}Ga_{(1-j1-k1)}In_{k1}As$, and active layer 40 in the window region includes a well layer having a composition of $Al_{h2}Ga_{(1-h2-i2)}In_{i2}As$ and barrier layers having a composition of $Al_{j2}Ga_{(1-j2-k2)}In_{k2}As$. In this example, a difference between the composition ratios of the well layer and the barrier layers in the window region, i.e., j2-h2 and i2-k2, is smaller than a difference between the composition ratios of the well layer and the barrier layers in a region other than the window region, i.e., j1-h1 and i1-k1. That is, the relationship j1-h1>j2-h2 or i1-k1>i2-k2 is satisfied. Another example of the window region in which the quantum well structure is disordered is that the composition of the window region is an average composition of the well layer and the barrier layers in a region other than the window region.

In the present embodiment, the length of window region 80 (length in the first direction of window region 80) differs between the front side and the rear side of the resonator. For example, length D of the window region on the front side is from 10 μm to 20 μm and the length of the window region on the rear side is from 7 μm to 17 μm. Accordingly, the length of the window region on the front side having a high light density is larger. This reduces the damage on the end face of semiconductor laser element 14. Length D of the window region is the distance from cleaved end face 121 in the first direction to the region edge where Zn is diffused. Note that ratio D/L of length D of the window region on the front side to length L of the resonator is greater than 0.03. Note that ratio D/L may be less than 0.1. Note that window region 80 formed in active layer 40 (i.e., window region 80 in the same layer as active layer 40) includes: a stable window region having an energy band gap that is at least 30 meV greater than an energy band gap of active layer 40; and a transition region where the energy band gap varies continuously. The stable window region and the transition region are formed in stated order from the cleaved end face 121 side along the first direction. Length D1 of the stable window region is a distance from cleaved end face 121 in the first direction to the edge of the stable window region, and is approximately equal to the length of the region where Zn is diffused in the same layer as active layer 40. Length D2 of the transition region is a distance from the interface between the stable window region and the transition region in the first direction to the region end where Zn is diffused. Note that ratio D1/D2, which is a ratio of length D1 of the stable window region on the front side to length D2 of the transition region, is less than 3.0. Note that ratio D1/D2 may be greater than 1.0. Moreover, ratio D1/L of length D1 of the stable window region on the front side to length L of the resonator is greater than 0.01. Note that ratio D1/L may be less than 0.08. In the present embodiment, length D1 of the stable window region on the front side is 10 μm, length D2 of the transition region on the front side is 5 μm, length D1 of the stable window region on the rear side is 7 μm, and length D2 of the transition region on the rear side is 5 μm.

In the window structure formed by diffusing an impurity, the impurity diffusion progresses isotropically. Therefore, if the impurity diffusion region is to be placed in a small region of less than or equal to 10 μm (i.e., length D of window region is to be less than or equal to 10 μm), the energy band gap cannot be increased sufficiently, and the effect of preventing deterioration of the end face cannot be obtained. Therefore, deterioration of the end face progresses while the semiconductor laser element is being driven.

As described above, in the present embodiment, semiconductor laser element 14 includes a substrate on which semiconductor layer 100 is stacked and which contains GaAs. Moreover, semiconductor layer 100 includes: n-type cladding layer 33 including n-type AlGaInP, n-side light guide layer 34, active layer 40 having a quantum well structure, a p-side light guide layer 51, and a p-type cladding layer including p-type AlGaInP, which are formed in stated order on substrate 24. Window region 80 includes a region in which part of the quantum well structure of active layer 40 is disordered.

[1-2. Method of Manufacturing Semiconductor Laser Element]

Next, a method of manufacturing the semiconductor laser element according to the present embodiment will be described. In the present embodiment, each step of manufacturing the semiconductor laser element described above as an example of a semiconductor laser element will be described.

[1-2-1. Step of Forming Semiconductor Layer]

Figure 5:
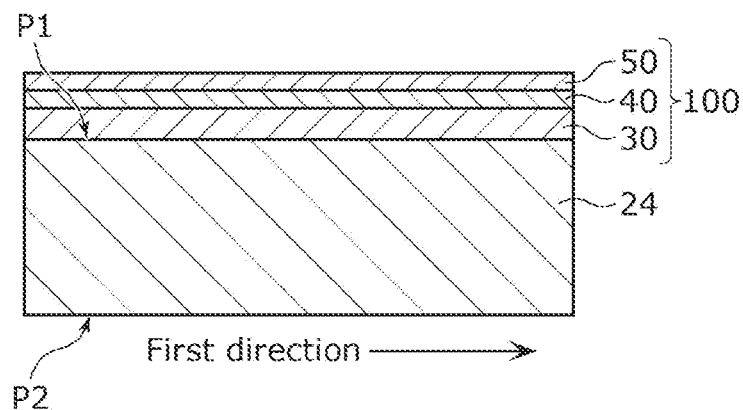
FIG. 5 is a schematic sectional view of a substrate, illustrating an outline of a step of forming a semiconductor layer of the semiconductor laser element according to Embodiment 1.

A step of forming the semiconductor layer according to the present embodiment will be described with reference to FIG. 5. FIG. 5 is a schematic sectional view of substrate 24, illustrating the outline of a step of forming a semiconductor layer of semiconductor laser element 14 according to the present embodiment. Until a cleaving step which will be described below, each structural component of the semiconductor laser elements is formed on a wafer substrate. The wafer substrate before being diced will be described using the same reference numeral as substrate 24, which is a substrate after the wafer substrate is diced.

As illustrated in FIG. 5, substrate 24 having first face P1 and second face P2 is prepared first, and semiconductor layer 100 including active layer 40 is formed on first face P1 of substrate 24. Each of the layers that are contained in semiconductor layer 100 is stacked, for example, using metal organic chemical vapor deposition (MOCVD). In the present embodiment, first semiconductor layer 30 including a first conductivity-type layer; active layer 40; and second semiconductor layer 50 including a second conductivity-type layer are formed as semiconductor layer 100 in stated order from the substrate 24 side.

Figure 6:
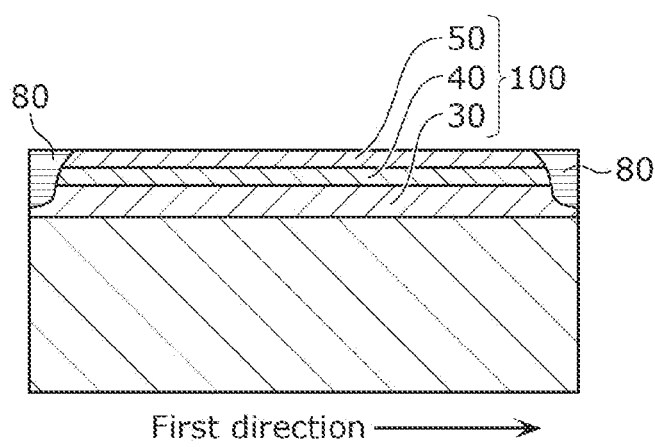
FIG. 6 is a schematic sectional view of the substrate and the semiconductor layer, illustrating a step of forming a window region according to Embodiment 1.

Subsequently, in the present embodiment, what is called a window region is formed in a region in the vicinity of the resonator face of the semiconductor laser element. The following describes a step of forming the window region with reference to FIG. 6. FIG. 6 is a schematic sectional view of substrate 24 and semiconductor layer 100, illustrating a step of forming window region 80 according to the present embodiment. FIG. 6 illustrates a section in the first direction and the stacking direction of substrate 24 and semiconductor layer 100.

For example, as illustrated in FIG. 6, it possible to form window regions 80 by thermally diffusing Zn into the p-type contact layer included in second semiconductor layer 50. More specifically, a ZnO film serving as a diffusion source and an SiN or SiO film for preventing evaporation of Zn are formed above p-type contact layer 57 in stated order, and Zn is diffused into the vicinity of the resonator face of semiconductor layer 100 through a thermal treatment. This increases the energy band gap of active layer 40. With this, it is possible to form window regions 80 in which light absorption in active layer 40 is reduced. Such window regions 80 can prevent deterioration in the vicinity of the resonator faces of semiconductor laser element 14.

[1-2-2. Step of Forming Waveguide]

Figure 7:
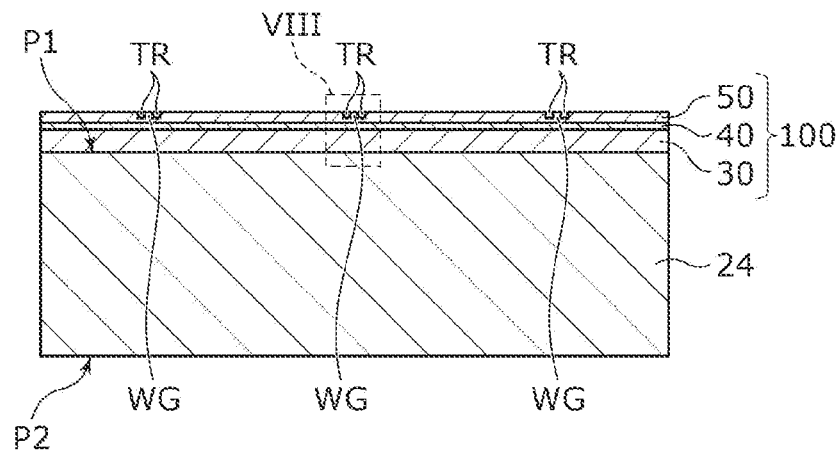
FIG. 7 is a schematic sectional view of the substrate and the semiconductor layer, illustrating an outline of a step of forming a waveguide according to Embodiment 1.

Next, a step of forming a waveguide will be described with reference to FIG. 7. FIG. 7 is a schematic sectional view of substrate 24 and semiconductor layer 100, illustrating an outline of a step of forming the waveguide according to the present embodiment. FIG. 7 illustrates a section of substrate 24 and semiconductor layer 100 perpendicular to the first direction.

As illustrated in FIG. 7, a plurality of pairs of trenches TR that extend perpendicular to the plane of FIG. 7 are formed in second semiconductor layer 50 formed above substrate 24. With this, waveguides WG each of which uses ridge 50r between a pair of trenches TR (see FIG. 2) are formed. In this manner, a plurality of waveguides WG extending in the first direction are formed in semiconductor layer 100. The width of each trench TR is, for example, approximately 13 μm, and the width of each waveguide WG (i.e., the width of ridge 50r) is, for example, approximately 3 μm. In this structure, the current injected from p-type contact layer 57 flows only to ridges 50r, and the current is concentrated in a portion below each ridge 50r in active layer 40. Population inversion necessary for laser oscillation is achieved by a low injection current.

The method of forming waveguide WG is not particularly limited. In the present embodiment, a mask is formed with a photolithography technique using $SiO_2$, for example, to form ridge 50r. Subsequently, the pair of trenches TR, i.e., ridge 50r is formed by non-selective etching such as dry etching. In this case, dry etching is performed on p-type contact layer 57, p-type graded interlayer 56, p-type interlayer 55, p-type third cladding layer 54, and p-type second cladding layer 53. P-type second cladding layer 53 is removed partway and not completely removed.

Next, a protective film including $SiO_2$, for example, is formed on the entire top face of semiconductor layer 100 in which ridges 50r are formed. Note that this $SiO_2$ protective film is used as a mask when waveguide WG is formed.

Next, the $SiO_2$ protective film is removed only from the bottom portions of trenches TR through dry etching. At this time, the side walls and the top portions of ridges 50r are covered with the $SiO_2$ protective film.

Subsequently, p-type second cladding layer 53 is completely removed by selective etching, such as wet etching, only from the bottom portions of trenches TR that are not covered with the $SiO_2$ protective film. Accordingly, p-type first cladding layer 52 is exposed at the bottom portions of trenches TR. Subsequently, the $SiO_2$ protective film is removed by wet etching, for example. Accordingly, waveguide WG can be formed in semiconductor layer 100.

Here, the aforementioned dry etching technique that can be used in the present embodiment may be anisotropic plasma etching. For example, a dry etching technique using inductively coupled plasma (ICP) or electron cyclotron resonance (ECR) plasma may be used.

In addition, a mixed gas of $SiCl_4$ and Ar is used as an etching gas, but $SiCl_4$ may be replaced by, for example, chlorine gas or boron trichloride gas.

In the present embodiment, the ICP method is employed as a dry etching method, and a mixed gas of $SiCl_4$ and Ar is used as an etching gas. Conditions for the etching may be as follows: the volume content of $SiCl_4$ in the mixed gas is from 5% to 12%; the temperature of a lower electrode above which the semiconductor substrate is disposed is from 150° C. to 200° C.; the pressure inside a chamber is from 0.1 Pa to 1 Pa; bias power of the lower electrode is from 50 W to 150 W; and the ICP power is from 200 W to 300 W. However, the conditions for etching are not limited to the above, and may be suitably selected.

[1-2-3. Step of Forming First Protective Film]

Next, a step of forming a first protective film will be described with reference to FIG. 8.

Figure 8:
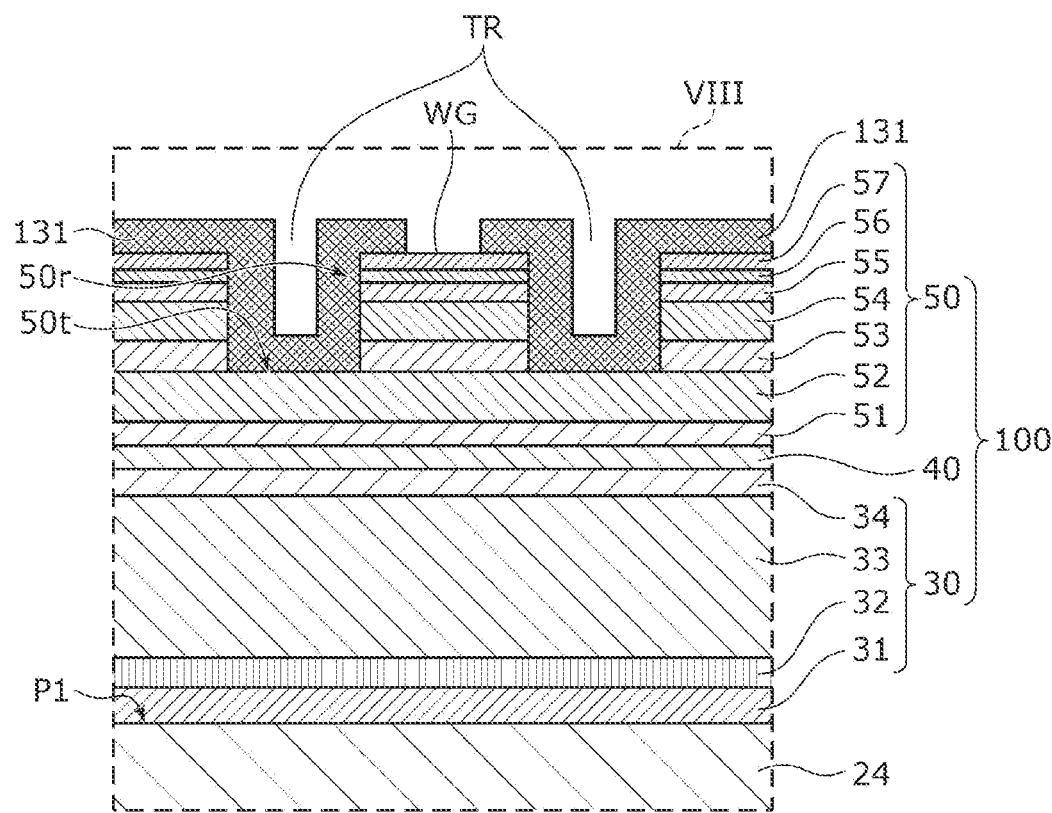
FIG. 8 is a schematic sectional view of the substrate and the semiconductor layer, illustrating an outline of a step of forming a first protective film according to Embodiment 1.

FIG. 8 is a schematic sectional view of substrate 24 and semiconductor layer 100, illustrating an outline of a step of forming the first protective film according to the present embodiment. FIG. 8 is an enlarged view of the region within dotted frame VIII shown in FIG. 7, illustrating the step of forming the first protective film. As illustrated in FIG. 8, first protective film 131 is formed on semiconductor layer 100 other than a portion of the top portion of ridge 50r. The portion of the top portion of ridge 50r in which first protective film 131 is not formed is a region in contact with p-type lower electrode 151, which will be formed later.

The method of forming first protective film 131 is not particularly limited. In the present embodiment, first protective film 131 including SiN and having a thickness of approximately 180 nm is formed on a portion of the top portion and the sides of ridge 50r, trenches TR, and upper face 50t (i.e., the flat portions on both sides of ridge 50r).

First protective film 131 has a lower refractive index than the p-type cladding layer. Therefore, first protective film 131 can confine laser light horizontally. Moreover, because first protective film 131 is transparent to laser light, light absorption can be reduced. Therefore, a low-loss waveguide WG can be achieved.

[1-2-4. Step of Forming Electrode]

Next, a step of forming electrodes will be described. The electrodes to be formed in this step are a p-side electrode and an n-side electrode for supplying power to the semiconductor laser element manufactured by the manufacturing method according to the present embodiment.

P-side lower electrode 151 is formed above semiconductor layer 100 including top portion of ridge 50r and trenches TR. Moreover, p-side upper electrode 152 is formed on p-side lower electrode 151. P-side lower electrode 151 is connected to second semiconductor layer 50 via an opening in first protective film 131 provided on ridge 50r.

The configurations and methods of forming p-side lower electrode 151 and p-side upper electrode 152 are not particularly limited. In the present embodiment, a mask is formed by photolithography using a resist, a pre-process of wet etching is performed, and then a Ti film, a Pt film, and an Au film are formed in stated order using a vapor deposition method. In this manner, p-side lower electrode 151 is formed.

Next, a pattern for p-side upper electrode 152 is formed with photolithography using a resist mask, and an Au film having a thickness of from 2.0 μm to 5.0 μm is formed with an electrolytic plating method. Subsequently, the resist is removed using a lift-off process to form patterned p-side upper electrode 152.

Next, substrate 24 is ground until the thickness from second face P2 of substrate 24 to p-side upper electrode 152 is approximately 100 μm. Subsequently, a resist mask is formed on second face P2 (i.e., the ground face of substrate 24) using photolithography, pre-processed by wet etching, and then an AuGe film, an Ni film, an Au film, a Ti film, a Pt film, a Ti film, a Pt film, and an Au film are formed in stated order by a vapor deposition method. Subsequently, the resist is removed using a lift-off process to form patterned n-side electrode 160.

Through the above steps, substrate 24 above which semiconductor layer 100, p-side lower electrode 151, p-side upper electrode 152, and n-side electrode 160 are stacked is formed.

[1-2-5. Step of Cleaving Substrate]

Next, a step of cleaving the substrate will be described. In this step, substrate 24 on which semiconductor layer 100 formed through the above steps is stacked is cleaved along planes corresponding to resonator faces of semiconductor laser element 14. In other words, substrate 24 is cleaved so that window regions 80 are located in the respective resonator faces as illustrated in FIG. 3. With this, it is possible to form a bar-shaped substrate on which semiconductor layer 100 is formed from a wafer substrate on which semiconductor layer 100 is formed.

[1-2-6. Step of Forming Second Protective Film]

Next, a step of forming a second protective film will be described. In this step, for example, using ECR chemical vapor deposition, second protective films 132F and 132R are formed on cleaved end faces 121 formed through the cleaving step described above. Note that the method of forming second protective films 132F and 132R is not particularly limited.

The reflectance of laser light of second protective film 132F on the front side is approximately 30%, and the reflectance of laser light of second protective film 132R on the rear side is greater than or equal to 90%. In addition, semiconductor laser element 14 according to the present embodiment is formed by dividing the bar-shaped substrate formed through the above steps into chips.

[1-3. Functions and Advantageous Effects of Semiconductor Laser Element]

Next, functions and advantageous effects of semiconductor laser element 14 according to the present embodiment will be described with reference to FIGS. 9 to 14B.

Figure 10:
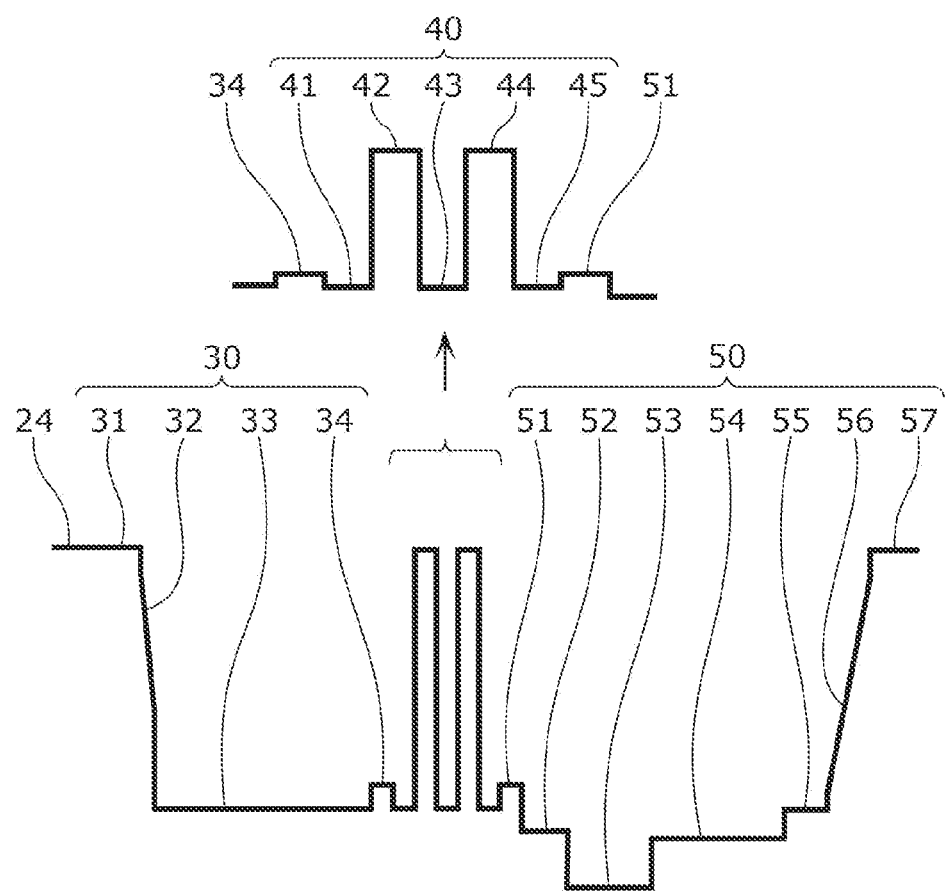
FIG. 10 is a diagram showing a refractive index distribution in the stacking direction of the semiconductor laser element according to Embodiment 1.

FIG. 9 is a table showing a layer structure of semiconductor laser element 14 according to the present embodiment. FIG. 10 is a diagram showing a refractive index distribution in the stacking direction of semiconductor laser element 14 according to the present embodiment. As shown in FIG. 9, in the semiconductor laser element according to the present embodiment, n-type cladding layer 33 consists of $(Al_xGa_{1-x})_{0.5}In_{0.5}P$, n-side light guide layer 34 consists of $(Al_yGa_{1-y})_{0.5}In_{0.5}P$, and when the p-type cladding layer consists of $(Al_zGa_{1-z})_{0.5}In_{0.5}P$, where z denotes an Al composition ratio, $0 < x-y < z-y$ is satisfied. Accordingly, the refractive index distribution of semiconductor laser element 14 in the stacking direction is as shown in FIG. 10. In other words, the refractive index (3.2476) of n-side light guide layer 34 is greater than the refractive index of n-type cladding layer 33 (3.2141), and a difference between the refractive index of n-side light guide layer 34 and the refractive index of n-type cladding layer 33 is less than a difference between the refractive index of n-type cladding layer 33 and the refractive index of the p-type cladding layer (3.1416). Note that, the Al composition ratio and the refractive index of the p-type cladding layer can be defined respectively using an average of Al composition ratios and an average of refractive indexes of p-type first cladding layer 52, p-type second cladding layer 53 and p-type third cladding layer 54.

Figure 11:
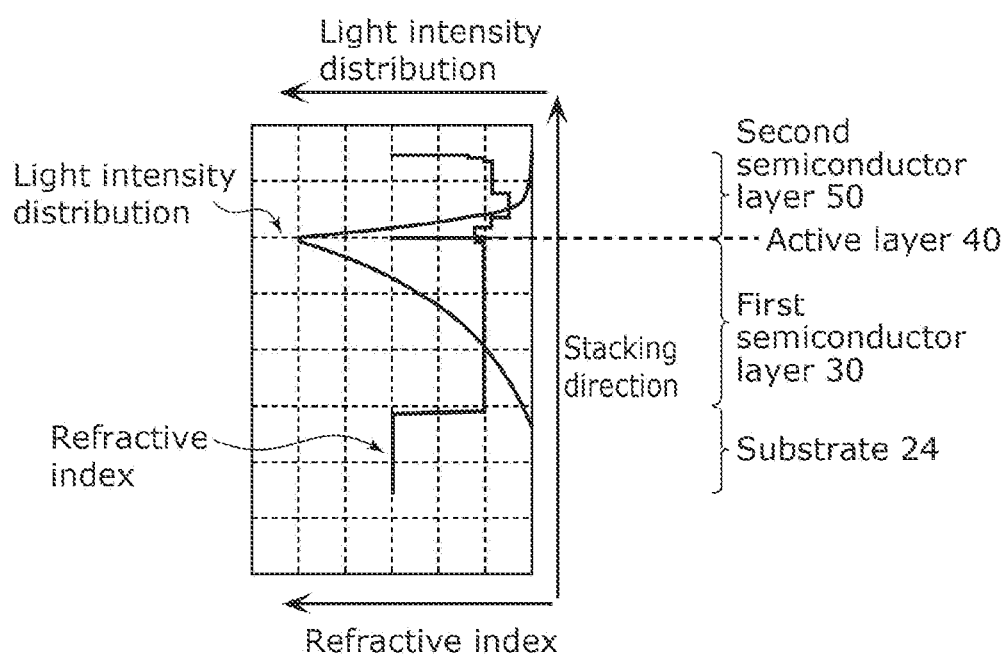
FIG. 11 is a diagram showing the refractive index distribution and a light intensity distribution in the stacking direction of the semiconductor laser element according to Embodiment 1.

FIG. 11 is a diagram showing a relationship between the refractive index distribution and a light intensity distribution in the stacking direction of semiconductor laser element 14 according to the present embodiment. Due to the relationship of the refractive indexes corresponding to the relationship of Al composition ratios between the respective layers of semiconductor layer 100, the light intensity distribution is biased toward the substrate 24 side from active layer 40. The light intensity distribution includes the fundamental mode and the higher order mode, and the light intensity distribution in the higher order mode is larger in dimension than the light intensity distribution in the fundamental mode. In addition, because the impurity concentration of substrate 24 is higher than the impurity concentration of n-type cladding layer 33, light absorption of substrate 24 is greater than that of n-type cladding layer 33. Therefore, the waveguide loss in substrate 24 is greater in the higher order mode than in the fundamental mode. As a result, it is possible to reduce oscillation in the higher order mode. In this way, oscillation in the higher order mode, which affects the vertical divergence angle of laser light, can be reduced, thereby reducing variation in the vertical divergence angle.

In addition, when the Al composition ratio of p-type first cladding layer 52 is $(Al_wGa_{1-w})_{0.5}In_{0.5}P$, and $x-y<w-x$ and $w<z$ are satisfied, the difference between the refractive index of the n-side light guide layer 34 and the refractive index of n-type cladding layer 33 is less than the difference between the refractive index of n-type cladding layer 33 and the refractive index (3.1799) of p-type first cladding layer 52, and the refractive index of p-type first cladding layer 52 is greater than the refractive index of the p-type cladding layer. This makes it possible to place the center of the light intensity distribution toward active layer 40 and increase the confining rate of light. Accordingly, it is possible to suppress decrease in optical output power and increase in operating current, which occur due to increase in waveguide loss in the fundamental mode and the higher order mode.

Figure 12A:
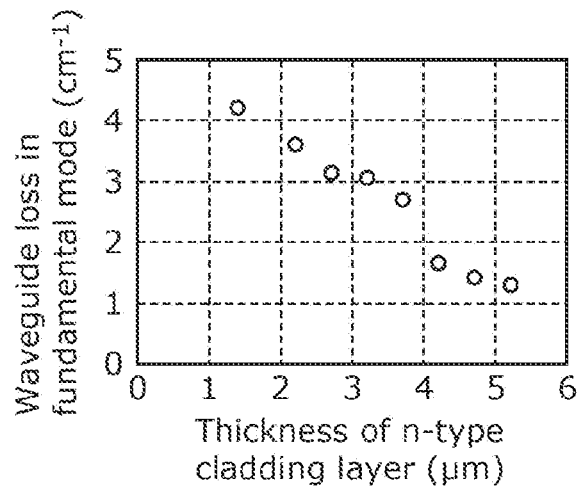
FIG. 12A is a graph showing a relationship between a thickness of the n-type cladding layer and waveguide loss in a fundamental mode of the semiconductor laser element according to Embodiment 1.
Figure 12B:
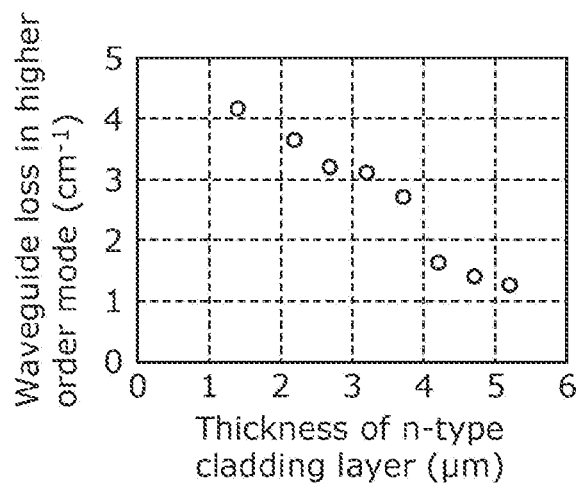
FIG. 12B is a graph showing a relationship between the thickness of the n-type cladding layer and waveguide loss in a higher order mode of the semiconductor laser element according to Embodiment 1.
Figure 12C:
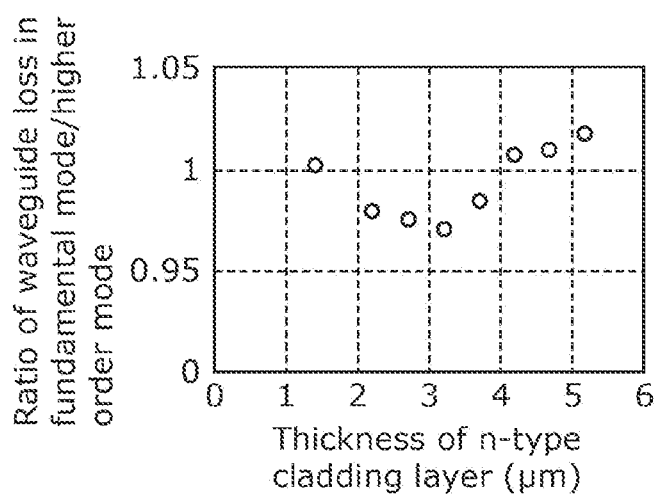
FIG. 12C is a graph showing a relationship between a ratio of the waveguide loss in the fundamental mode to the waveguide loss in the higher order mode, and the thickness of the n-type cladding layer of the semiconductor laser element according to Embodiment 1.

FIG. 12A to FIG. 12C are graphs showing relationships between the thickness of n-type cladding layer 33 and waveguide loss of semiconductor laser element 14 according to the present embodiment. FIG. 12A and FIG. 12B respectively show simulation results of the waveguide loss in the fundamental mode and the higher order mode. FIG. 12C shows simulation results of ratios between waveguide loss in the fundamental mode and the waveguide loss in the higher order mode. Because length L of the resonator is less than or equal to 300 µm in semiconductor laser element 14 according to the present embodiment, reducing the ridge width (in other words, the stripe width) to cut off the higher order mode increases the operating voltage and generates a larger amount of heat. This reduces the optical output power, which makes it difficult to reduce the higher order mode by reducing the ridge width. As shown in FIG. 12A and FIG. 12B, reducing the thickness of n-type cladding layer 33 increases the waveguide loss in both of the fundamental mode and the higher order mode. However, as shown in FIG. 12C, the ratio of the waveguide loss in the fundamental mode to the waveguide loss in the higher order mode is less than 1 when the thickness of n-type cladding layer 33 is within the range of from 1.5 µm to 4.0 µm. In other words, the waveguide loss is greater in the higher order mode than in the fundamental mode. Therefore, by reducing the thickness of n-type cladding layer 33, oscillation in the higher order mode can be reduced and variation in the vertical divergence angle can be suppressed.

When the thickness of n-type cladding layer 33 is reduced, bias of the light intensity distribution toward the substrate 24 side further increases, and more light is absorbed in substrate 24 having an impurity concentration higher than the impurity concentration of n-type cladding layer 33. This results in a greater waveguide loss. In order to minimize decrease in optical output power and to stabilize a characteristic of the vertical divergence angle, the thickness of n-type cladding layer 33 may be greater than the thickness of the p-type cladding layer and may be less than or equal to 4.0 µm. In the present embodiment, the thickness of n-type cladding layer 33 is 3.2 µm, and the maximum impurity concentration is $7.5 \times 10^{17}$ cm$^{-3}$. The impurity concentration of substrate 24 ranges from $8.0 \times 10^{17}$ cm$^{-3}$ to $2 \times 10^{18}$ cm$^{-3}$. Also, since first protective film 131 has a lower refractive index than p-type first cladding layer 52 and p-type second cladding layer 53, the light intensity distribution spreads farther toward the substrate 24 side in portions of trenches TR on the sides of the ridge from which p-type first cladding layer 52 is exposed from p-type second cladding layer 53 than the light intensity distribution in the portion directly below the ridge. Therefore, the waveguide loss on the sides of the ridge in the higher order mode increases compared with the waveguide loss in the portion directly below ridge 50r in the higher order mode. As a result, it is possible to reduce oscillation in the higher order mode and further reduces variation in vertical divergence angle.

Also, the refractive index (3.2141) of n-type cladding layer 33 is greater than the refractive index (3.2107) of the barrier layer. As a result, the bias of the light intensity distribution toward the substrate 24 side further increases, oscillation in the higher order mode can be reduced, and variation in the vertical divergence angle can be further reduced.

Note that the population inversion is formed by an injection current in the well layer in active layer 40 consisting of the same GaAs, and stimulated emission is preferentially performed than absorption.

Figure 13A:
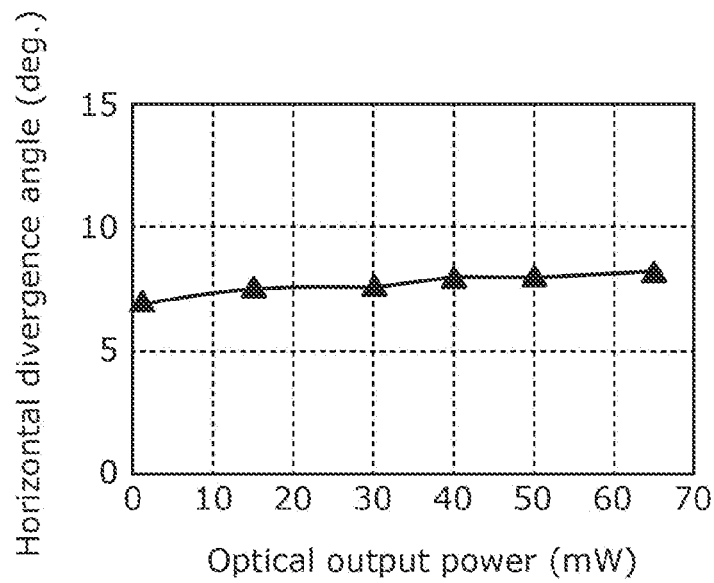
FIG. 13A is a graph showing dependence of a characteristic of a horizontal divergence angle on optical output power of a semiconductor laser element in a comparison example.
Figure 13B:
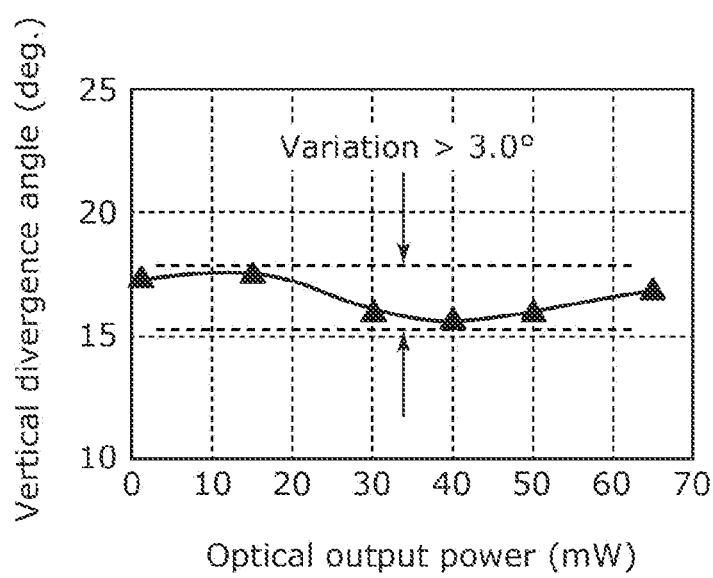
FIG. 13B is a graph showing dependence of a characteristic of a vertical divergence angle on optical output power of the semiconductor laser element in the comparison example.

FIG. 13A and FIG. 13B are graphs respectively showing dependence of a characteristic of a horizontal divergence angle on optical output power and dependence of a characteristic of a vertical divergence angle on optical output power of a semiconductor laser element in a comparison example. The semiconductor laser element in the comparison example differs from semiconductor laser element 14 according to the present embodiment in that the thickness of the n-type cladding layer is greater than 4.0 µm. Other than that, the semiconductor laser element in the comparison example is the same as semiconductor laser element 14. As shown in FIG. 13A and FIG. 13B, the characteristic of the horizontal divergence angle of the semiconductor laser element in the comparison example shows a tendency of monotonic increase, but the vertical divergence angle shows a characteristic that decreases when the optical output power is from 20 mW to 40 mW, and after that, the vertical divergence angle increases. Variation in the vertical divergence angle is greater than 3.0°.

Figure 14A:
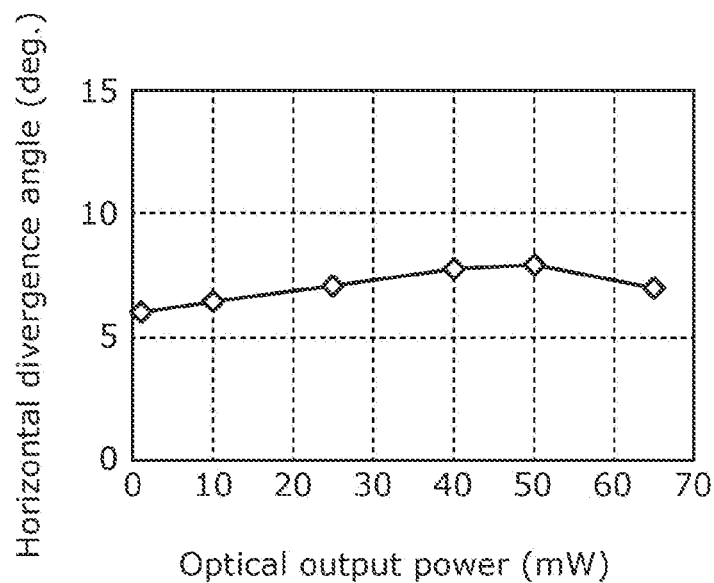
FIG. 14A is a graph showing dependence of a characteristic of a horizontal divergence angle on optical output power of the semiconductor laser element according to Embodiment 1.
Figure 14B:
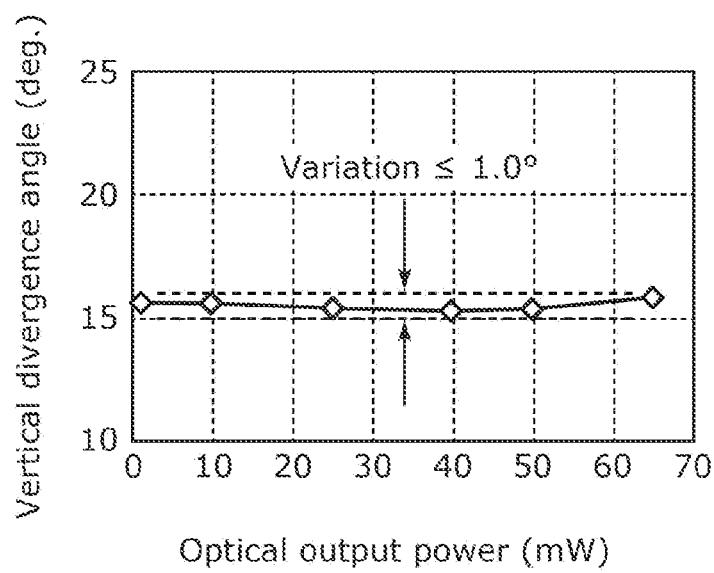
FIG. 14B is a graph showing dependence of a characteristic of a vertical divergence angle on optical output power of the semiconductor laser element according to Embodiment 1.

FIG. 14A and FIG. 14B are graphs respectively showing dependence of a characteristic of a horizontal divergence angle on optical output power and dependence of a characteristic of a vertical divergence angle on optical output power of semiconductor laser element 14 according to the present embodiment. In semiconductor laser element 14 according to the present embodiment, the characteristic of the horizontal divergence angle shows a tendency of monotonic increase, similar to that in the comparison example. In addition, variation in the characteristic of the vertical divergence angle is suppressed to less than or equal to 1.0° while the output power of the laser light continuously varies from 1 mW to 65 mW.

Embodiment 2

A semiconductor laser element according to Embodiment 2 will be described. The semiconductor laser element in the present embodiment differs from semiconductor laser element 14 according to Embodiment 1 in the configuration of n-type cladding layer 33. The following mainly describes differences between the semiconductor laser element according to the present embodiment and semiconductor laser element 14 according to Embodiment 1.

The Al composition ratio of n-type cladding layer 33 in the semiconductor laser element according to the present disclosure is not limited to the Al composition ratio of n-type cladding layer 33 according to Embodiment 1. The size of the vertical divergence angle can be adjusted by varying the Al composition ratio of n-type cladding layer 33. For example, the Al composition ratio of n-type cladding layer 33 may be varied in a range of from 0.1 to 0.2. In the present embodiment, n-type cladding layer 33 consists of n-$(Al_{0.15}Ga_{0.85})_{0.5}In_{0.5}P$ layer (refractive index: 3.2108).

A semiconductor laser element having such a configuration yields the same effects as semiconductor laser element 14 according to Embodiment 1.

Variations, etc.

Hereinbefore, the semiconductor laser elements according to one or more aspects of the present disclosure have been described based on Embodiments 1 and 2, but the present disclosure is not limited to Embodiments 1 and 2.

For example, in each of the embodiments, each of n-type cladding layer 33, n-side light guide layer 34, and p-side light guide layer 51 has a substantially uniform Al composition ratio and refractive index, but the Al composition ratios and refractive indexes do not have to be uniform. For example, each of the above layers may be made up of a plurality of layers each having a different composition. In this case, the Al composition ratio and refractive index of each of the above layers may be defined respectively using an average Al composition ratio and an average refractive index of all layers of each of the above layers.

Moreover, in each of the above embodiments, the p-type cladding layer is made up of a plurality of layers, but the p-type cladding layer may be made of a single layer having a uniform composition.

In addition, the present disclosure also includes embodiments as a result of adding various modifications that may be conceived by those skilled in the art to the embodiments, and embodiments obtained by combining structural components and functions in the embodiments in any manner as long as the combination does not depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor laser elements according to the present disclosure can be particularly used in a variety of light sources that need to be designed with an optical system using a laser element as a light source, because the semiconductor laser elements according to the present disclosure can suppress variation caused by optical output power having a characteristic of a vertical divergence angle.

The invention claimed is:

1. A semiconductor laser element including a resonator in which laser light resonates in a first direction between a front-side end face and a rear-side end face, the semiconductor laser element comprising:
    a first conductivity-type cladding layer disposed above a first conductivity-type semiconductor substrate;
    a first guide layer disposed above the first conductivity-type cladding layer;
    an active layer disposed above the first guide layer; and
    a second conductivity-type cladding layer disposed above the active layer, wherein
    a window region is formed in a region of the active layer including part of at least one of the front-side end face or the rear-side end face,
    an average composition of the first conductivity-type cladding layer is denoted by $(Al_xGa_{1-x})_{0.5}In_{0.5}P$, where x denotes an average Al composition ratio,
    the first guide layer consists of $(Al_yGa_{1-y})_{0.5}In_{0.5}P$, where y denotes an Al composition ratio,
    an average composition of the second conductivity-type cladding layer is denoted by $(Al_zGa_{1-z})_{0.5}In_{0.5}P$, where z denotes an average Al composition ratio, $0 < x - y \leq z - y$ is satisfied,
    $D/L > 0.03$ is satisfied, where L denotes a length of the resonator and D denotes a length of the window region in the first direction, and
    an impurity concentration of the first conductivity-type semiconductor substrate is higher than an impurity concentration of the first conductivity-type cladding layer.

2. The semiconductor laser element according to claim 1, wherein
    the second conductivity-type cladding layer includes a lower layer and an upper layer disposed in stated order from an active layer side,
    the lower layer consists of $(Al_wGa_{1-w})_{0.5}In_{0.5}P$, where w denotes an Al composition ratio, and
    $x - y < w - x$ and $w < z$ are satisfied.

3. The semiconductor laser element according to claim 2, wherein
    the second conductivity-type cladding layer includes an upper face that is an upper end face, and a ridge that protrudes upward from the upper face and extends in the first direction.

4. The semiconductor laser element according claim 3, wherein
    at the upper face, the lower layer is exposed from the upper layer.

5. The semiconductor laser element according to claim 4, further comprising:
    a dielectric film disposed on the upper face, wherein
    a refractive index of the dielectric film is lower than a refractive index of the lower layer.

6. The semiconductor laser element according to claim 1, wherein
    the active layer includes a well layer and barrier layers, and
    a difference between a composition ratio of the well layer and a composition ratio of the barrier layers in the window region is less than a difference between a composition ratio of the well layer and a composition ratio of the barrier layers in a region other than the window region.

7. The semiconductor laser element according to claim 6, wherein
    a refractive index of the first conductivity-type cladding layer is greater than a refractive index of the barrier layers.

8. The semiconductor laser element according to claim 1, wherein
    the window region is formed in a region of the active layer including part of a remaining one of the front-side end face and the rear-side end face.

9. The semiconductor laser element according to claim 1, wherein
    the laser light is emitted from the front-side end face,
    the window region is formed in a region including part of the front-side end face, and
    variation in a vertical divergence angle of the laser light in a stacking direction of the active layer is less than or equal to 1° while output power of the laser light continuously varies from 1 mW to 65 mW.

10. The semiconductor laser element according to claim 1, wherein
    a thickness of the first conductivity-type cladding layer is greater than a thickness of the second conductivity-type cladding layer, and is less than or equal to 4.0 μm.

11. The semiconductor laser element according to claim 1, wherein
    the length of the resonator is less than or equal to 300 μm.

12. The semiconductor laser element according to claim 1, wherein
    the first conductivity-type semiconductor substrate contains GaAs.

13. The semiconductor laser element according to claim 1, comprising:
    a second guide layer disposed between the second conductivity-type cladding layer and the active layer.

14. A semiconductor laser element including a resonator in which laser light resonates in a first direction between a front-side end face and a rear-side end face, the semiconductor laser element comprising:

a first conductivity-type cladding layer disposed above a first conductivity-type semiconductor substrate;
a first guide layer disposed above the first conductivity-type cladding layer;
an active layer disposed above the first guide layer; and
a second conductivity-type cladding layer disposed above the active layer, wherein
a window region is formed in a region of the active layer including part of at least one of the front-side end face or the rear-side end face,
an average composition of the first conductivity-type cladding layer is denoted by $(Al_xGa_{1-x})_{0.5}In_{0.5}P$, where x denotes an average Al composition ratio,
the first guide layer includes $(Al_yGa_{1-y})_{0.5}In_{0.5}P$, where y denotes an Al composition ratio,
an average composition of the second conductivity-type cladding layer is denoted by $(Al_zGa_{1-z})_{0.5}In_{0.5}P$, where z denotes an average Al composition ratio,
$0<x-y<z-y$ is satisfied,
$D/L>0.03$ is satisfied, where L denotes a length of the resonator and D denotes a length of the window region in the first direction,
the active layer includes a well layer and barrier layers,
a difference between a composition ratio of the well layer and a composition ratio of the barrier layers in the window region is less than a difference between a composition ratio of the well layer and a composition ratio of the barrier layers in a region other than the window region, and
a refractive index of the first conductivity-type cladding layer is greater than a refractive index of the barrier layers.

15. A semiconductor laser element including a resonator in which laser light resonates in a first direction between a front-side end face and a rear-side end face, the semiconductor laser element comprising:
a first conductivity-type cladding layer disposed above a first conductivity-type semiconductor substrate;
a first guide layer disposed above the first conductivity-type cladding layer;
an active layer disposed above the first guide layer; and
a second conductivity-type cladding layer disposed above the active layer, wherein
a window region is formed in a region of the active layer including part of at least one of the front-side end face or the rear-side end face,
the first conductivity-type cladding layer includes an $(Al_xGa_{1-x})_{0.5}In_{0.5}P$ layer, where x denotes an Al composition ratio,
the first guide layer includes $(Al_yGa_{1-y})_{0.5}In_{0.5}P$, where y denotes an Al composition ratio,
the second conductivity-type cladding layer includes an $(Al_zGa_{1-z})_{0.5}In_{0.5}P$ layer, where z denotes an Al composition ratio,
$0<x-y<z-y$ is satisfied,
$D/L>0.03$ is satisfied, where L denotes a length of the resonator and D denotes a length of the window region in the first direction, and
an impurity concentration of the first conductivity-type semiconductor substrate is higher than an impurity concentration of the first conductivity-type cladding layer.

16. The semiconductor laser element according to claim 15, wherein
a thickness of the first conductivity-type cladding layer is greater than a thickness of the second conductivity-type cladding layer, and is less than or equal to 4.0 μm.

17. The semiconductor laser element according to claim 15, wherein
the length of the resonator is less than or equal to 300 μm.

18. A semiconductor laser element including a resonator in which laser light resonates in a first direction between a front-side end face and a rear-side end face, the semiconductor laser element comprising:
a first conductivity-type cladding layer disposed above a first conductivity-type semiconductor substrate;
a first guide layer disposed above the first conductivity-type cladding layer;
an active layer disposed above the first guide layer; and
a second conductivity-type cladding layer disposed above the active layer, wherein
a window region is formed in a region of the active layer including part of at least one of the front-side end face or the rear-side end face,
the first conductivity-type cladding layer includes an $(Al_xGa_{1-x})_{0.5}In_{0.5}P$ layer, where x denotes an Al composition ratio,
the first guide layer includes $(Al_yGa_{1-y})_{0.5}In_{0.5}P$, where y denotes an Al composition ratio,
the second conductivity-type cladding layer includes an $(Al_zGa_{1-z})_{0.5}In_{0.5}P$ layer, where z denotes an Al composition ratio,
$0<x-y<z-y$ is satisfied,
$D/L>0.03$ is satisfied, where L denotes a length of the resonator and D denotes a length of the window region in the first direction,
the active layer includes a well layer and barrier layers,
a difference between a composition ratio of the well layer and a composition ratio of the barrier layers in the window region is less than a difference between a composition ratio of the well layer and a composition ratio of the barrier layers in a region other than the window region, and
a refractive index of the first conductivity-type cladding layer is greater than a refractive index of the barrier layers.

19. The semiconductor laser element according to claim 18, wherein
a thickness of the first conductivity-type cladding layer is greater than a thickness of the second conductivity-type cladding layer, and is less than or equal to 4.0 μm.

20. The semiconductor laser element according to claim 18, wherein
the length of the resonator is less than or equal to 300 μm.

* * * * *